United States Patent
Sun et al.

(10) Patent No.: US 6,200,652 B1
(45) Date of Patent: Mar. 13, 2001

(54) METHOD FOR NUCLEATION AND DEPOSITION OF DIAMOND USING HOT-FILAMENT DC PLASMA

(75) Inventors: Biwu Sun; Leo W. M. Lau, both of London (CA)

(73) Assignee: CVD Diamond Corporation, London (CA)

(*) Notice: Subject to any disclaimer, the term of this patent is extended or adjusted under 35 U.S.C. 154(b) by 0 days.

(21) Appl. No.: 09/532,061

(22) Filed: Mar. 21, 2000

Related U.S. Application Data

(62) Division of application No. 08/888,830, filed on Jul. 7, 1997.

(51) Int. Cl.$^7$ ...................................................... H05H 1/20
(52) U.S. Cl. ............... 427/573; 427/249.11; 427/249.12; 427/255.23; 427/255.7; 427/314; 427/402; 427/577; 427/593
(58) Field of Search ............................... 427/573, 249.11, 427/249.12, 255.23, 255.7, 314, 402, 577, 593

(56) References Cited

U.S. PATENT DOCUMENTS

| | | |
|---|---|---|
| 5,698,328 | 12/1997 | Bunshah et al. |
| 5,993,919 | 11/1999 | Tsuno et al. |

FOREIGN PATENT DOCUMENTS

| | | |
|---|---|---|
| 0 254 312 | 1/1988 | (EP) . |
| 0 254 560 | 1/1988 | (EP) . |

(List continued on next page.)

OTHER PUBLICATIONS

S. Koizumi et al.—"Epitaxial growth of diamond thin films on cubic boron nitrade [111] surfaces by dc plasma chemical vapor deposition", Appln. Phys. Lett. vol. 57, No. 6, pp. 563–565 (1990) (No Month Available).

(List continued on next page.)

Primary Examiner—Bernard Pianalto
(74) Attorney, Agent, or Firm—Brinks Hofer Gilson & Lione

(57) ABSTRACT

A method and apparatus for nucleation and growth of diamond by hot-filament DC plasma deposition. The apparatus uses a resistively heated filament array for dissociating hydrogen in the reactant gas. For two sided diamond growth, configurations of substrate-hot filament-grid-hot filament-substrate or substrate-hot filament-hot filament-substrate configuration are used. For the latter configuration, two independent arrays of filaments serve as both hot filament and grid, and AC or DC plasma is maintained between the filament arrays. For this and the other electrode configurations, the grid electrode is positively biased with respect to the hot filaments to maintain a plasma. The plasma potential gradient across the grid and the hot-filament draws ions from the plasma towards the filaments. To further increase deposition rates, the filament array is biased negatively with respect to the substrate holder so that a DC plasma is also maintained between the substrate and filament array. During nucleation, the filament adjacent to the substrate holder is biased positively relative to the substrate so that more ions are accelerated towards the substrate, which in turn enhances the flow of growth precursors towards the substrate resulting in a high diamond nucleation density on the substrate without the need for scratching or diamond-seeding pretreatment. This nucleation method simplifies the growth process and provides a convenient and economical means for heteroepitaxial growth of diamond nuclei on single crystal substrates like Si (100).

17 Claims, 6 Drawing Sheets

FOREIGN PATENT DOCUMENTS

| | | |
|---|---|---|
| 60-065796 | 4/1985 | (JP) . |
| 63-30397 | 2/1988 | (JP) . |
| 1-052699 | 2/1989 | (JP) . |
| 3-103397 | 4/1991 | (JP) . |
| 5-270982 | 10/1993 | (JP) . |

OTHER PUBLICATIONS

X. Jiang et al.—"Heteroepitaxial diamond growth on (100) silicon", Diamond and Related Materials, No. 2, pp. 1112–1113 (1993).

B. R. Stoner et al.—"Textured diamond growth on (100) β–SiC via microwave plasma chemical vapor deposition", Aool. Phys. Lett. 60(6), pp. 698–700 (1992).

Fujita et al.—"Summaries of Lecture in the Fourth Diamond Symposium", pp. 13–14 (1991).

Inuzuka et al.—Extended Abstracts (the 43rd Spring Meeting, 1996), the Japan Society of applied Physics and Related Societies, No.s 2, p. 403, 26a–T–9.

Yugo et al.—"Generation of diamond nuclei by electric field in plasma chemical vapor deposition", Appl. Phys. Lett. vol. 58, No. 10, pp. 1036–1038 (1991).

Chen et al.—"Synthesis of oriented textured diamond films on silicon via hot filament chemical vapor deposition", Appl. Phys. Lett. vol. 67, pp. 1853–1855 (1995).

METHOD FOR NUCLEATION AND DEPOSITION OF DIAMOND USING HOT-FILAMENT DC PLASMA

CROSS-REFERENCE TO RELATED US PATENT APPLICATION

This patent application is a divisional patent application of U.S. patent application Ser. No. 08/888,830 filed on Jul. 7, 1997, entitled APPARATUS AND METHOD FOR NUCLEATION AND DEPOSITION OF DIAMOND USING HOT-FILAMENT DC PLASMA, allowed and which is incorporated herein by reference in its entirety.

FIELD OF THE INVENTION

The present invention relates to the field of chemical vapor deposition (CVD) of diamond films, and more particularly, to a method and apparatus for nucleation and growth of diamond films by hot filament DC plasma CVD.

BACKGROUND OF THE INVENTION

Hot filament chemical vapor deposition (HFCVD) has been extensively used by researchers to deposit polycrystalline diamond on a variety of substrates. The technique and reactor designs typically used for HFCVD of diamond are described in detail in an article entitled "Growth Of Diamond Particles From Methane-Hydrogen Gas" published in J. Materials Science 17, 3106(1982) by Matusumoto et al. Since this disclosure, numerous researchers have attempted to improve the HFCVD technique. This development can be found in the review article by C. E. Spear entitled "Diamond-ceramic coating of the future" published in J. Am. Ceram. Soc. 72(2), 171(1989). The reactor generally comprises a resistively heated filament and a heated or cooled substrate stage which are housed in a reactor chamber with pumping and pressure monitoring facilities. The filament is made from a high melting-point refractory metal that is used to dissociate hydrogen and other molecules in a feed gas which normally contains a mixture of hydrogen and hydrocarbon. Atomic hydrogen and other dissociated products subsequently react with the feed gas to generate precursors responsible for diamond formation. The precursors then diffuse to and condense on the substrate for the formation of polycrystalline diamond. The separation between the filament and the substrate is normally in the range 0.5 to 5 cm. With this small distance, a sufficient amount of growth precursors diffuses to the substrate prior to their recombination into more stable molecules.

A major advantage of HFCVD of diamond films, relative to other methods of diamond film growth such as microwave plasma CVD (MWCVD), radiofrequency CVD, and plasma jet CVD, is the low equipment investment costs, and the ease in scaling up the production to a large area substrate. The diamond growth rate using HFCVD does not normally exceed 5 $\mu$m/hr and is typically about 1 $\mu$m/hr (see e.g., International PCT Patent Publication WO 91/14798, by Garg, et al., entitled "An Improved Hot Filament Chemical Vapor Deposition Reactor"), which is not high enough for economically viable thick film production. A major disadvantage of HFCVD, as with other known diamond growth methods, is that it requires scratching or diamond-seeding of the substrate surface to initiate diamond nucleation. Such a pretreatment induces a high defect concentration on the substrate surface and thus generally precludes the possibility of obtaining heteroepitaxial growth of diamond. This pretreatment increases the CVD diamond production costs.

A method of achieving nucleation enhancement is disclosed by Yugo et al. in an article entitled "Generation Of Diamond Nuclei By Electric Field In Plasma Chemical Vapor Deposition" and published in Applied Physics Letters 58(10), 1036–1038(1991) which proposes a predeposition of diamond nuclei on a silicon mirror surface prior to the conventional diamond CVD growth process. Yugo et al. reported that diamond nuclei growth required a high methane content in hydrogen and did not occur below 5%, and that high densities of nuclei occurred only above 10% methane. Yugo et al. also reported that the substrate bias against the CVD plasma should be below 200 volts to avoid sputtering and the typical bias was 70 volts. The total time duration for the pretreatment was limited to between 2 to 15 minutes.

More recently, Stoner et al. (see e.g., World Patent # 93/13242, entitled "Nucleation Enhancement For Chemical Vapor Deposition Of Diamond") and Jiang et al. (see e.g., "Epitaxial Diamond Thin Films On (001) Silicon Substrates", Applied Physics Letters 62(26), 3438–3440 (1993)) have independently disclosed diamond nucleation enhancement by negatively biasing the substrate against the CVD plasma during MWCVD of diamond films on silicon. More importantly, both of these groups showed that the preservation of the crystallinity of the silicon substrate surface as a result of the elimination of any scratching/diamond-seeding pretreatment, together with the nucleation enhancement, allows the heteroepitaxial formation of diamond (100) nuclei on Si (100). In the method described by Jiang, et al., the substrate was biased at –100 to –300 V relative to the microwave plasma with a typical recipe for MWCVD of diamond using $CH_4/H_2$. In the method described by Stoner et al., the negative bias of the substrate required for nucleation enhancement was claimed to be not less than 250 volts. The nucleation of diamond and heteroepitaxial nucleation of diamond with a modified HFCVD-DC plasma method and apparatus, which require much less equipment investment than the MWCVD approach, is one advantage of the present invention discussed hereinafter.

Modifications of the conventional HFCVD by coupling it with DC plasma CVD have been proposed previously by A. Ikegaya and T. Masaaki in JP 173366 (1986), JP 75282 (1987), and European Patent Publication 0254312 A1. In this approach, a hot filament array is used as a thermionic electron emitter and a grid electrode is inserted between the hot filament array and the substrate. The filament array and the substrate are both negatively biased against the grid electrode in order to form two DC plasma zones, one between the filament array and the grid electrode, and the other between the grid electrode and substrate. In these two plasma zones, the plasma density in the grid-filament zone is much higher than that between the grid-substrate zone because of thermionic electron emission from the hot filaments. In the grid-filament zone, ions are extracted towards the filaments, i.e., further away from the substrate. Through gas phase collision, this extraction will also move the reactants generated near the filament away, instead of towards, the substrate. Ikegaya et al. reported a growth rate of 2 $\mu$m/hr on a tungsten carbide substrate using 1% methane in hydrogen, a power density of 40 W/cm$^2$ between the hot filament and grid and 20 W/cm$^2$ between the grid and substrate with a hot filament temperature of about 2000° C. and a substrate temperature of 980–1010° C. and a pressure of 90 torr. A growth rate of 12.5 $\mu$m/hr was also reported for a gas mixture of 2% ($CH_{32}CN$ in $H_2$ with a power density of 60 W/cm$^2$ between the filament and grid, and a power density of 40 W/cm$^2$ between the grid and substrate. Ikegaya et al. noted that a DC plasma power density higher than 200

W/cm² between the grid and substrate led to sputter-etching of the substrate. Ikegaya et al. reported that this problem arises because the negative bias on the substrate against the grid attracts ions to the substrate. A high DC plasma power density results in a high bombardment energy and high current density, and the induced energetic particle bombardment causes detrimental sputter-etching.

A logical approach for eliminating the sputtering problem is to connect the substrate to the grid or simply to discard the grid. A DC plasma can still be maintained by biasing the filament negatively against the substrate. In fact, A. Ikegaya and N. Fujimori showed such a configuration in a JP 176762 and a PCT Patent Publication WO92/01828. However, a drawback to both of these designs is that they do not allow for any ion extraction towards the substrate during nucleation and growth.

Thus, there still exists a need to modify the HFCVD method and apparatus in order to provide an economical approach to control energetic particle bombardment for improved diamond nucleation and growth.

SUMMARY OF THE INVENTION

The present invention discloses a method and apparatus to nucleate diamond in a high density on substrates without any scratching or diamond-seeding requirement, and to efficiently grow diamond coatings at high growth rates. The design of the method and apparatus takes into account the limitations of the aforementioned hot filament DC plasma devices and processes.

The present invention provides a method of growing a diamond film by hot filament discharge comprising positioning a substrate having a deposition surface on a substrate holder in a vapor deposition chamber, providing a grid electrode spaced from the substrate deposition surface and providing a filament array electrode interposed between the grid electrode and the substrate deposition surface. The method includes flowing a gas mixture comprising hydrogen and gas containing carbon into the vapor deposition chamber and resistively heating the filament array electrode to a temperature in a range of from about 1800° C. to about 2600° C. with the substrate being heated to a temperature in the range from about 600° C. to about 1100° C. The method includes nucleating the substrate by biasing the filament array electrode at a positive voltage with respect to the substrate holder, and biasing the grid electrode at a voltage positive with respect to the filament array electrode. Thereafter the grid electrode is biased at a voltage positive with respect to the voltage on the filament array electrode to grow a diamond film on the deposition surface.

During the step of nucleating the substrate the substrate may be biased at ground potential and the filament array electrode biased to a potential in a range from about 20 to about 300 Volts with respect to the substrate holder. The grid electrode is biased to a voltage in a range from about 20 to about 300 Volts with respect to the filament array electrode.

During the step of growing the diamond film after the step of nucleating, the substrate holder and filament array electrode may be biased at ground potential and the grid electrode biased at a voltage in a range from about 20 to 300 Volts with respect to the filament array electrode.

Alternatively, during the step of growing the diamond film after the step of nucleation the substrate holder may be biased at ground potential and the filament array electrode biased at a negative voltage with respect to the substrate holder wherein the negative voltage being in a range from about −20 to about −300 Volts with respect to the substrate holder.

In another aspect of the invention there is provided a hot filament DC discharge plasma apparatus for synthesizing a diamond film. The apparatus comprises a deposition chamber having a gas inlet for flowing reactant gases into the deposition chamber; a conducting substrate holder having a surface for holding a substrate, and means for heating and cooling the substrate holder. The apparatus includes a grid electrode spaced from the surface of the substrate; a filament array electrode interposed between the grid electrode and the surface of the substrate holder, and includes means for resistively heating the filament array electrode. The apparatus includes means for biasing the grid electrode, the filament array electrode and the substrate holder to produce a hot filament DC discharge plasma. The means for biasing includes means for adjusting the bias potential on the grid electrode and the filament array electrode relative to the substrate holder and each other.

In another aspect of the invention there is provided a hot filament DC discharge plasma apparatus for synthesizing a diamond film, comprising a deposition chamber having a gas inlet for flowing reactant gases into the deposition chamber; first and second spaced conducting substrate holders each adapted to support a substrate having a surface on which the diamond film is to be synthesized, and means for heating and cooling the first and second substrate holders. The invention includes a grid electrode located between the first and second substrate holders; a first filament array electrode interposed between the first substrate holder and the grid electrode and a second filament array electrode interposed between the second substrate holder and the grid electrode. The apparatus includes means for resistively heating the first and second filament array electrodes. The apparatus is provided with power supply means for biasing the grid electrode, the first and second filament array electrodes and the first and second substrate holders to produce a hot filament DC discharge plasma and including means for adjusting the bias potential on the grid electrode, and on the first and second filament array electrodes relative to the first and second substrate holders respectively.

In another aspect the present invention provides a hot filament discharge plasma apparatus for synthesizing a diamond film comprising a deposition chamber having a gas inlet for flowing reactant gases into the deposition chamber; first and second spaced conducting substrate holders each adapted to support a substrate having a surface on which a diamond film is to be synthesized, and means for heating and cooling first and second substrate holders. The apparatus includes a first filament array electrode spaced from the first substrate holder and a second filament array electrode interposed between the first filament array electrode and the second substrate holder, and means for resistively heating the first and second filament array electrodes. The apparatus includes means for biasing the first and second filament array electrodes and the first and second substrate holders to produce a hot filament discharge plasma and includes means for adjusting the bias potential on the first and second filament array electrodes relative to the first and second substrate holders respectively.

More particularly, in the present invention a hot filament is placed between a grid electrode and the substrate. The plane of the grid is parallel to the plane of filament. The grid can be either parallel wires, or rods, or mesh, or plate with holes. The grid can be either cooled or heated. The direction of the elements of the grid (wires or rods) can be either perpendicular or parallel, or at any angle to the direction of filament. The distance between the hot filament and substrate is preferably less than 2 cm, and the distance between hot filament and grid is preferably less than 5 cm. In the normal operation of the system, the growth substrate holder is preferably biased at ground potential. The power density for resistively heating the filaments is about 30–500 W/cm$^2$. During nucleation of diamond, the filaments are biased positively at 20–300 Volts relative to the substrate holder and the grid electrode is biased positively in the range of 20–300 Volts relative to the filament array. As such, a DC plasma can be maintained between the grid and filaments. Ions in the plasma are extracted towards the substrate for particle bombardment assisted nucleation. The nucleation process typically takes less than ten minutes. During diamond nucleation, a plasma is maintained between the filaments and grid with the thermionic emission from the hot filament cathode to enhance the plasma density. The unique substrate-hot filament-grid configuration of the present invention allows the maintenance of the substrate at a potential even more negative than the hot filament cathode such that effective ion extraction towards the substrate can be induced for the enhanced diamond nucleation.

During diamond growth, the substrate holder may be biased at ground potential. The filament array is either not biased at all or biased negatively relative to the substrate holder. The negative biasing voltage on the filament array is normally −20 to −300 Volts. The grid is biased positively at 20–300 Volts relative to the filament array. The typical plasma energy density is about 20–300 W/cm$^2$. When the filaments are not biased, a DC plasma will be mainly maintained between the grid and filaments. The large cathode voltage drop near the filament will draw some ions from the plasma towards the filaments. Due to the small mean free path for collision in the processing pressure (about 0.01 mm at 50 Torr and 1500K), such an ion extraction in the direction towards the substrate will result in the partitioning of the ion energy into kinetic energy for neutrals in the collision cascades. In turn, these accelerated neutrals will have a net average velocity towards the substrate, and have an average energy higher than the average thermal energy in the system, and can thus enhance the reaction probability towards diamond growth. But the average energy will be much less than a few electron volts, which is not sufficient for inducing any significant sputtering action on the substrate. The motion of neutrals towards the substrate enhances the arrival rate of the precursors beyond that induced by simple diffusion, and enhances the diamond growth rate.

With the filament array biased at a negative potential relative to the substrate holder, a DC plasma can also be maintained between the filament array and substrate. However, a high DC power input in this operation mode may lead to the raise of the substrate surface temperature outside the diamond growth window, which is a limitation common to other prior arts of hot filament DC plasma techniques. Accordingly, under the normal operation in the present invention, the plasma power input between the grid and filaments is higher than that between the filaments and substrate.

BRIEF DESCRIPTION OF THE DRAWINGS

The method and apparatus for growing diamond coatings using the hot-filament DC plasma method according to the present invention will now be described, by way of example only, reference being had to the accompanying drawings, in which.

DETAILED DESCRIPTION OF THE INVENTION

Prior Art

Figure 1:
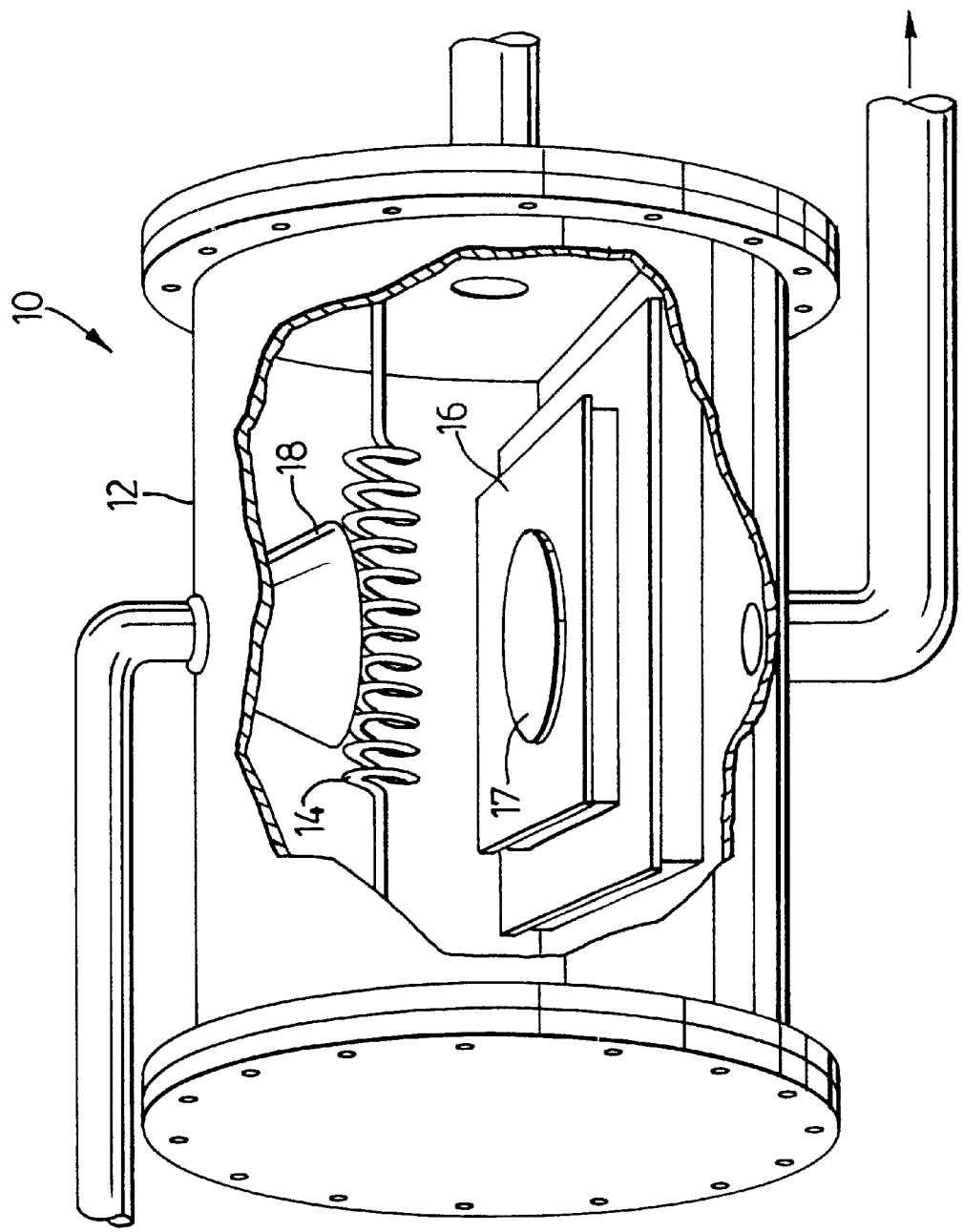
FIG. 1 is a schematic diagram of a conventional HFCVD reactor according to typical configurations of prior art.

A schematic representation of a typical HFCVD reactor used in prior art diamond growth processes is shown in FIG. 1. The reactor 10 comprises a chamber 12 enclosing a resistively heated filament 14 and a heated or cooled substrate holder 16 on which a substrate 17 is placed. Pumps and pressuring monitoring equipment is included (not shown). The reactant gas mixture is fed into the chamber through a gas diffuser unit 18. The filament 14 is made from a high melting-point refractory metal, such as tungsten or tantalum, and is heated to between 1800–2300° C. to dissociate hydrogen and other molecules in the reactant gas mixture which normally contains a mixture of hydrogen and hydrocarbon. Atomic hydrogen and other dissociated products subsequently react with the reactant gas mixture to generate precursors responsible for diamond formation. The precursors then diffuse to and condense on substrate 17 for the formation of polycrystalline diamond. The separation between the filament and the substrate is normally in the range of 0.5 to 5 cm. The temperature of the substrate is generally maintained in the range of 700 to 1000° C. The deposition rate and reaction efficiency are determined by a combination of the rate of reactant generation near the filaments, the rate of reactant diffusion to the substrate, and the probability of diamond formation on the substrate.

Figure 2:
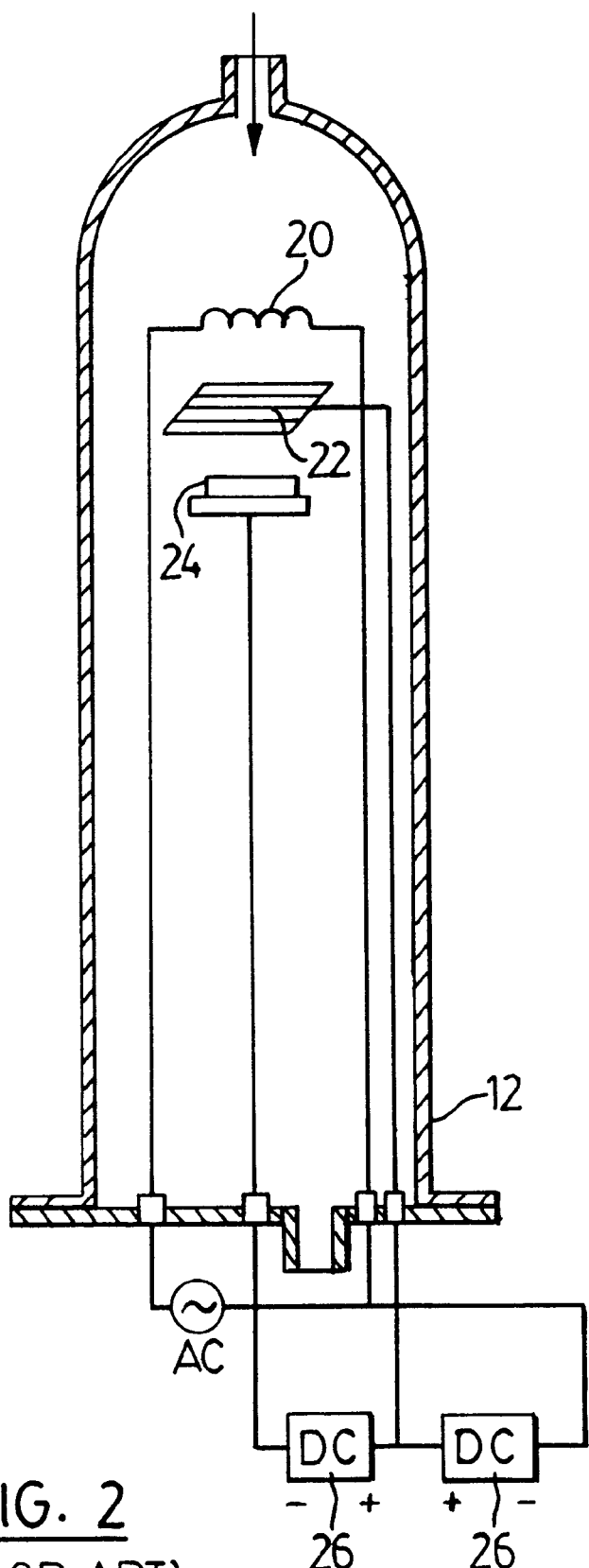
FIG. 2 is a schematic diagram of a hot filament DC plasma CVD reactor with a typical filament-grid-substrate configuration of prior art.

FIG. 2 illustrates several modifications of the conventional HFCVD by coupling the process with direct current (DC) plasma CVD as proposed by A. Ikegaya and T. Masaaki in JP 173366 (1986), JP 75282 (1987), and European Patent 0254312 A1. Referring to FIG. 2, in this approach, a hot filament 20 is used as a thermionic electron emitter and a grid electrode 22 is inserted between the hot filament 20 and the substrate 24. The filament 20 and the substrate 24 are both negatively biased against the grid electrode 22 using power supplies 26 in order to form a DC plasma between the filament 20 and grid 22, and the grid 22 and substrate 24.

Present Invention

Figure 3:
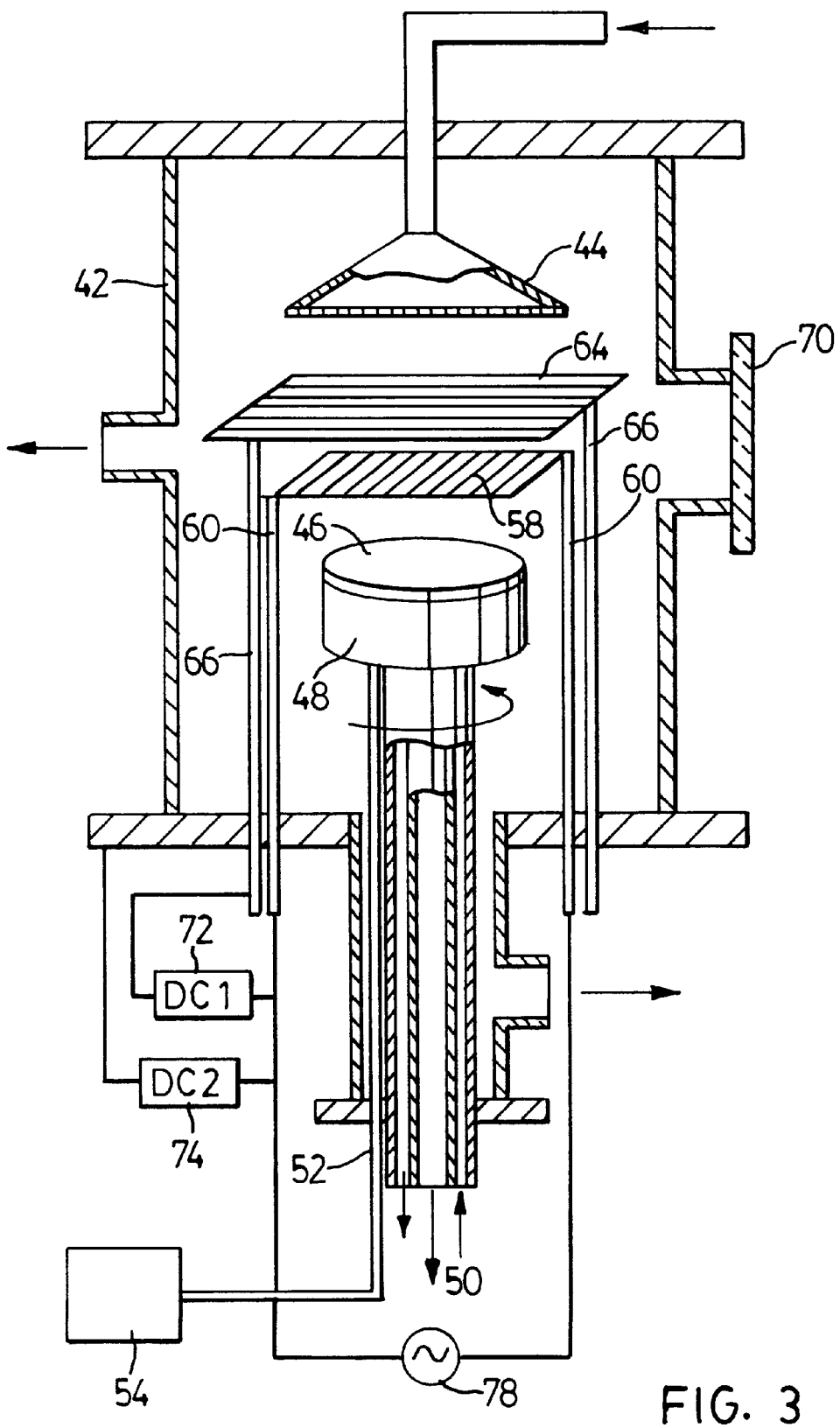
FIG. 3 is a schematic diagram of the apparatus according to the present invention.

FIG. 3 is a schematic diagram of an apparatus 40 for implementing the method of nucleating and growing diamond in accordance with the present invention. The reactant gas mixture is introduced into a deposition chamber 42 through a gas shower unit 44. The substrate 46 on which the diamond film is being deposited is placed on a substrate holder 48 which may be heated or cooled by a heat exchange fluid running through conduits 50. The substrate holder 48 is equipped with a thermocouple 52 for sensing the temperature of the substrate holder and may be connected to a substrate temperature controller 54 that controls the temperature of the heat exchange fluid.

A filament array 58 is mounted on conducting rods 60 and is spaced above substrate holder 48. A grid electrode 64 is mounted on conducting rods 66 and is spaced above filament array 58 so that a sequential grid-filament-substrate assembly is provided. The filament array 58 is preferably spaced less than 2 cm from the top of substrate 46. The grid electrode 64 is preferably spaced less than 5 cm from filament array 58. Grid electrode 64 is shown as a wire grid in FIG. 3 but may also be constructed from a wire mesh, metal rods or a perforated metal plate able to withstand the operating temperatures.

Filament array 58 is comprised of a plurality of conductive metal filaments with a high melting point such as Ta and W. Filament array 58 can withstand resistive heating to temperatures above 2000° C., the preferred temperature range for dissociating hydrogen in the reactant gas. Grid electrode 64 and filament array 58 are shown as being substantially parallel in chamber 42 but it will be appreciated that these components do not need to be parallel to each other.

DC power supplies 72 and 74 are used to provide the DC bias requirements during substrate nucleation and diamond coating growth. More specifically, power supply 74 is used to maintain the bias requirements between the filament array 58 and substrate 46 and power supply 72 provides the bias requirements between the grid electrode 64 and filament array 58. It will be understood that the substrate on which the diamond film is being deposited is typically electrically conductive so the substrate will be biased to the same potential as the substrate holder. During diamond deposition the filament array 58 is maintained in the temperature range of 1800–2600° C. using a power supply 78 which is preferably an AC power supply. The power density is about 30–500 W/cm². The plasma power density during growth is about 20–300 W/cm². The grid electrode 64 may be either heated or cooled during deposition of the diamond film. The grid electrode 64 may be heated resistively and/or by plasma energy. Grid 64 may comprise hollow rods and may be cooled by running a heat exchange fluid through the centre of the electrode rods.

The temperature of filament array 58 and grid electrode 64 is monitored by an optical pyrometer (not shown) which is located outside the deposition chamber 42 and focussed onto filament array 58 through a window 70 in the vacuum chamber. The gas flow and pressure are controlled by conventional flow meters and controllers, vacuum pumps and gauges (not shown).

The reactant gas mixture comprises hydrogen, at least one carbon source including hydrocarbons, hydrocarbons containing oxygen and/or nitrogen, hydrocarbons containing halogens, carbon vapor, CO, $CO_2$, and optionally other gases such as $O_2$, $F_2$, and $H_2O$. The reactant gas pressure is set in the range between 10 to 500 Torr. The power density is about 30–500 W/cm². The plasma power density during growth is about 20–300 W/cm².

Referring to FIG. 3, in the normal operation of the system, the growth substrate 46 is maintained at ground potential for both the step of nucleation and diamond growth. The power density for resistively heating the filament array 58 is about 30–500 W/cm². During the step of nucleation of diamond film the filament array 58 is biased positively with respect to the substrate, preferably in the range of 20–300 Volts positive with respect to the substrate. It will be understood that maintaining the substrate at ground potential is preferred but it could be maintained at potentials in the vicinity of ground so long as the filament array 58 is at a more positive potential than the substrate holder. The grid electrode 64 is biased positively with respect to the filament array, preferably in the range of 20–300 Volts with respect to the filament array 58 so that during nucleation the grid electrode 64 is maintained at a voltage more positive than the filament array. Therefore, during diamond nucleation, a plasma is maintained between the filament electrode 58 and grid 64 and thermionic emission from the heated filament array 58 enhances the plasma density. Ions in the DC plasma are extracted towards the substrate 46 for particle bombardment assisted nucleation. The nucleation process according to the method disclosed herein advantageously takes less than ten minutes. The unique configuration of the present invention allows the maintenance of the substrate 46 at potentials more negative than the heated filament array 58 thereby resulting in ion extraction towards the substrate 46 to achieve enhanced diamond nucleation.

During the step of diamond growth, the filament array 58 is either electrically connected to the substrate holder 48, or alternatively is biased negatively relative to the substrate holder 48, preferably in the range of −20 to −300 Volts. Grid electrode 64 is biased positively with respect to the filament array 58, and preferably in the range 20–300 Volts with respect to the filament array 58 whether or not the filament array is held at ground. The typical plasma energy density is about 20–300 W/cm². When the filament array 58 is not biased with respect to the substrate holder 48 (so that both are at the same potential), a DC plasma will be maintained between the grid electrode 64 and filament array 58. The large cathode voltage drop near the filament array 58 will extract some ions from the plasma towards the filaments. Due to the small mean free path for collision at the processing pressure (about 0.01 mm at 50 Torr and 1500K), such an ion extraction in the direction towards the substrate 46 will result in the partitioning of the ion energy into kinetic energy for neutrals in the collision cascades. In turn, these accelerated neutrals will have a net average velocity towards the substrate 46 and an average energy higher than the average thermal energy in the system thereby resulting in an enhanced reaction probability. However, the average energy will be much less than a few electron volts, which is not sufficient for inducing any significant sputtering action on the substrate 46. The motion of neutrals towards the substrate 46 enhances the arrival rate of the growth precursors beyond that induced by simple diffusion, thereby enhancing the diamond growth rate.

In the alternative case in which the filament array 58 is biased at a negative potential relative to the substrate holder 48, a DC plasma can also be maintained between the filament array 58 and substrate 46. However, a high DC power input in this operation mode may lead to an increase in temperature of the substrate surface outside the diamond growth window, which is a limitation common to other prior art hot filament DC plasma growth techniques. Accordingly, under the normal operation in the present invention, the plasma power input between the grid electrode 64 and filament array 58 is higher than that between the filament array and substrate 46.

Figure 4:
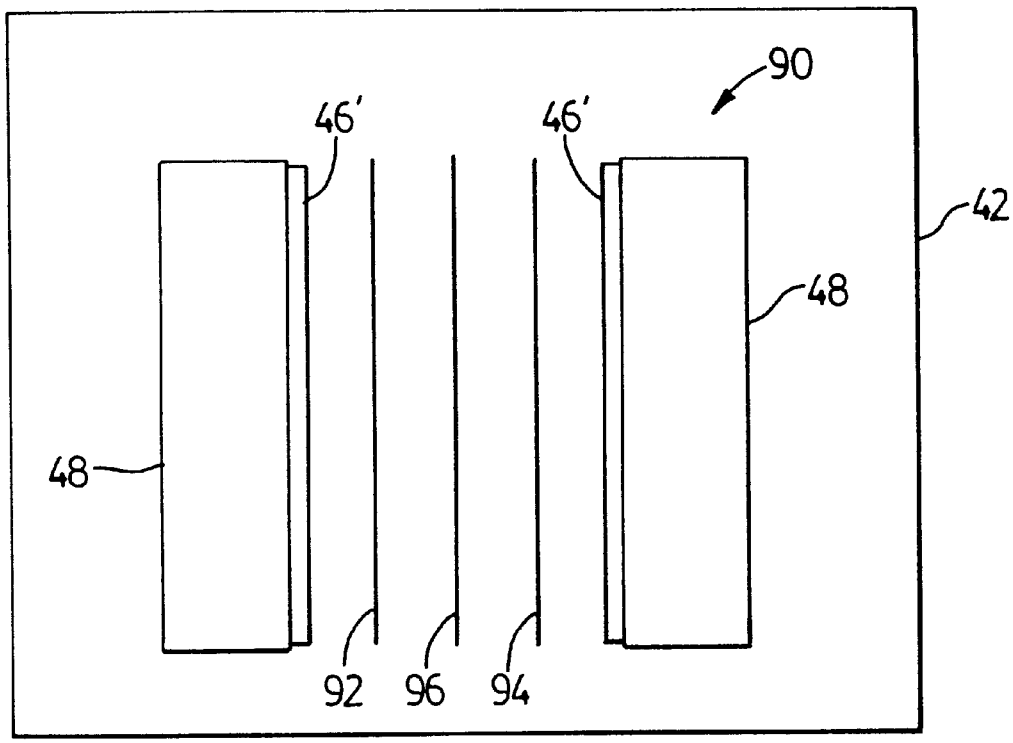
FIG. 4 is a schematic diagram of an apparatus for depositing diamond coatings onto multiple substrates according to the present invention.

FIG. 4 shows a substrate-hot filament-grid-hot filament-substrate configuration at 90 for depositing diamond coatings onto two substrates 46' affixed to the opposed substrate holders 48. The array 90 may be assembled in vacuum chamber 42 vertically as shown or alternatively the entire assembly may be rotated 90° to a horizontal position within the chamber. The two hot filament arrays 92 and 94 may be heated either by independent DC or AC power supplies, or by a shared DC or AC power supply (not shown). Each of the two filament arrays 92 and 94 are provided with a DC power supply for biasing the arrays with respect to ground (not shown). A grid electrode 96 is located between filament arrays 92 and 94 and is biased using a DC power supply (not shown) and is biased at a positive potential relative to the filament arrays 92 and 94, preferably in range from 20–300 Volts. During the nucleation step, the filament arrays 92 and 94 are biased at a positive potential relative to the associated substrates 46' adjacent thereto. During diamond growth following the nucleation step, the filament arrays 92 and 94 are either not biased at all or biased negatively with respect the associated substrates 46', similar to the process described above with respect to the apparatus of FIG. 3. The operation range is the same as those discussed in relation to FIG. 3.

Figure 5:
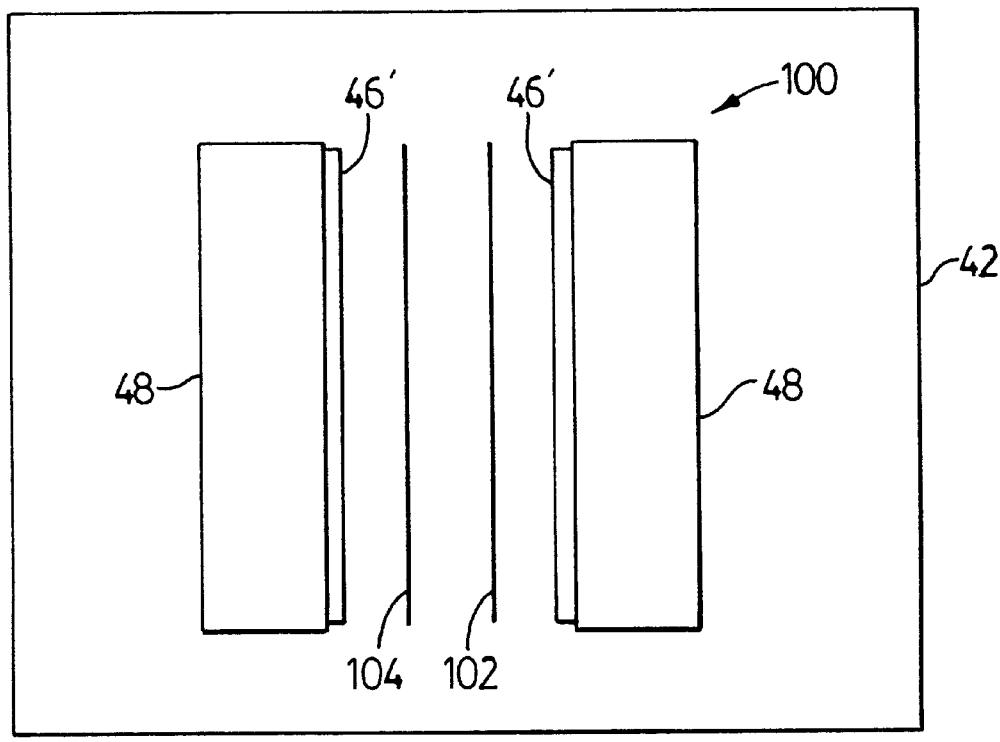
FIG. 5 is a schematic diagram of another embodiment of an apparatus for depositing diamond coatings.

FIG. 5 shows another configuration 100 for growing diamond coatings according to the present invention. Two filament arrays 102 and 104 are resistively heated by independent AC or DC power supplies (not shown). Both groups of hot filament arrays 102 and 104 serve the function of grid electrodes so that in operation the two filament arrays are biased appropriately to maintain the plasma discharge between the two filament arrays using either an AC or DC power supply, preferably an AC power supply (not shown).

The following non-limiting examples are to further illustrate the present invention.

EXAMPLE 1
Nucleation On Mirror-Smooth Quartz

Diamond nucleation even on mirror-smooth quartz was achieved by biasing filament array 58 at 89 Volts and heated to a temperature of about 2160° C. and biasing grid 64 at 200 Volts using the apparatus of FIG. 3. The reactant gas mixture was a mixture of methane/$H_2$ and respective flow rates were 6.5 standard cubic centimeters per minute (sccm) for methane and 300 sccm for hydrogen at a total pressure of 30 Torr. The nucleation process was maintained for about 10 minutes. The bias on filament array 58 was then switched off and the bias on grid electrode 64 was adjusted to 120 Volts for diamond growth. A coherent and uniform well faceted diamond film was obtained. Under the same growth conditions but without the nucleation step, only patches of diamond with non-uniform thickness were formed on mirror-smooth quartz. Subsequent runs showed that the nucleation time could be in the range of 2–5 minutes.

EXAMPLE 2
Heteroepitaxy Of Diamond On Silicon (see FIG. 6)

Figure 6A:
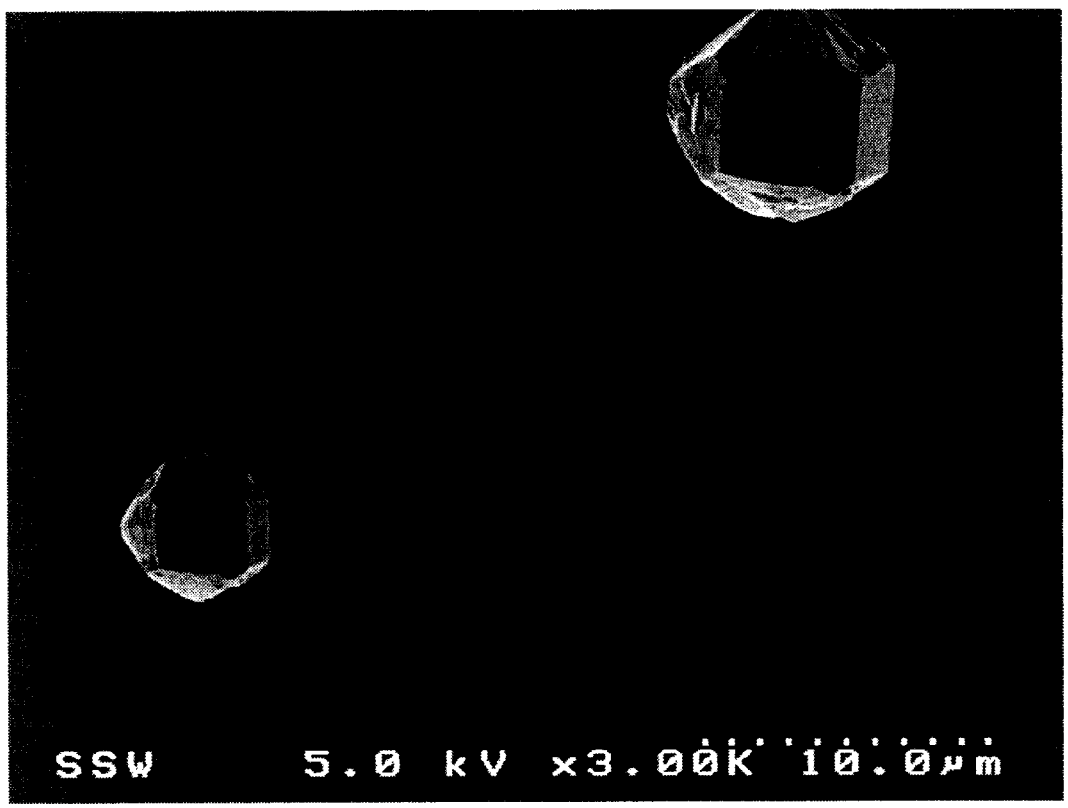
FIG. 6a is an optical micrograph of heteroepitaxially grown diamond on Si (diamond (100)//Si(100), diamond [110]//Si[110]) produced by the present invention in a low nucleation density mode.
Figure 6B:
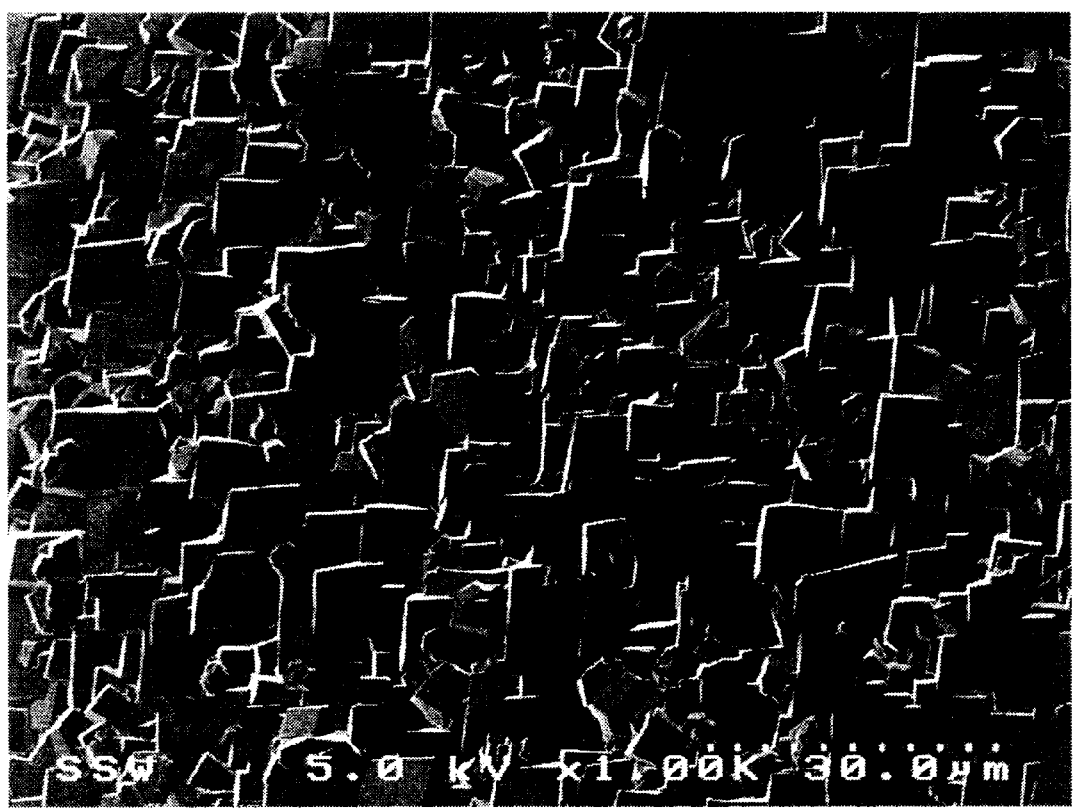
FIG. 6b is an optical micrograph of heteroepitaxially grown diamond on Si (diamond (100)//Si(100), diamond [110]//Si[110]) produced by the present method in a high nucleation mode.

Diamond oriented crystals were grown on silicon (100) by pre-cleaning the silicon with an HF solution, and nucleating with a filament temperature of about 2200° C., a grid bias of 219 Volts, and a filament bias of 130 Volts using the method and apparatus of FIG. 3. The reactant gas mixture was a mixture of methane/$H_2$ and respective flow rates were 6 sccm for methane and 300 sccm for hydrogen at a total pressure of 50 Torr. The nucleation time was about 10 minutes. The filament array was then biased to zero volts for diamond growth. The grid bias was changed to 112 Volts in this process. FIG. 6a clearly shows diamond (100) cubic crystals with its (100) face aligned with the Si (100), and the diamond direction [110] aligned with that of Si [110]. When diamond was grown with a high nucleation density, a coherent film with diamond (100)//Si(100), and diamond [110]//Si[110] was formed, as that shown in FIG. 6b.

EXAMPLE 3
Fast Deposition Of Diamond Films

A diamond coating was grown for 160 hours to 2.5 mm in thickness and 2" in diameter using the apparatus of FIG. 3. The pressure for diamond growth was 30 Torr and bias voltage on the grid electrode was 45 Volts relative to the filament array. The filament power density was about 170 W/cm$^2$ and the plasma power density was 40 W/cm$^2$. The growth rate was 16 μm/hr. Both Raman and X-ray photoelectron spectroscopy showed pure diamond and no impurities in the sample (data not shown).

EXAMPLE 4
Further Fast Deposition Of Diamond Films

A diamond coating was grown for 44 hours to 0.93 mm in thickness and 2" in diameter on a substrate using the apparatus of FIG. 3. The pressure for diamond growth was 30 Torr and bias voltage on the grid electrode was 50 Volts relative to the filament array. The growth rate was 21 μm/hr. Both Raman and X-ray photoelectron spectroscopy showed pure diamond and no impurities in the sample (data not shown). The filament power density was about 170 W/cm$^2$ and the plasma power density was about 50 W/cm$^2$.

The present method is advantageous over the diamond film growth process disclosed in EP0254560 because in the latter an ion extraction assisted diamond nucleation step cannot be performed due to the fact that the hot filaments are effective electron emitters, and thus most effectively used as a cathode in a DC plasma configuration. In EP0254560, the substrate can only be used effectively as an anode, and ions in the plasma are attracted to the cathode instead of anode.

The present method is advantageous over the diamond film growth process disclosed in EP0254312 because the grid electrode in EP0254312 is located between the filaments and substrate, and is always biased positively to the filaments to maintain a DC plasma. The ion extraction from the plasma between the grid and filaments towards the cathode hot filaments will induce a net flow of neutrals in the ion-neutral collision cascades away from the substrate. As such, many growth reactants generated on and near the hot filaments, and those generated in the plasma are not advantageously utilized and therefore wasted. Although when the substrate is biased negatively to the grid, some ions from the plasma can be extracted towards the substrate, these ions are extracted from the anode (the grid) of the DC plasma between the filaments and the grid. Hence, the extraction is not efficient, as compared to the technology disclosed in the present application.

Although a DC plasma can indeed be maintained by using the substrate as the cathode and grid as the anode, a DC glow discharge from two parallel electrodes separated by 1 cm in the typical diamond growth pressure of 50 Torrs will require a DC voltage much higher than that from the configuration illustrated in FIG. 3 for the same ion current density on the substrate. This is because the maintenance of a DC plasma between two cold electrodes relies on secondary electron emission as a consequence of ion bombardment of the cathode and a higher cathode voltage gives a higher electron emission, whereas the maintenance of a DC plasma with hot filaments as the cathode is facilitated by thermionic emission which is not directly related to the cathode voltage. Furthermore, the typical distance between the filament and the top of the substrate being coated in a hot filament CVD system is about 0.5–1 cm. Hence, the insertion of a grid into this space for uniform deposition is technically difficult. Any increase of the filament-substrate separation will decrease the efficiency of hot filament diamond CVD.

The diamond growth process described in WO92/01828 teaches a filament rack of resistively heated filaments located between two growth substrates such that a DC discharge can be ignited between the filaments and substrates. Such an arrangement is very similar to the technology described in EP254560. The main difference between this approach and the technology disclosed herein is the lack of flexibility in this approach and its inability to process ion extraction and particle bombardment induced diamond nucleation and growth. Further, for both the technologies disclosed by EP254560 and WO92/01828, the DC plasma current is directly drawn from the substrate. The problem is that the maximum power density is limited by the substrate temperature which cannot be higher than the diamond growth temperature range. In the technology disclosed in the present patent, the DC plasma can be maintained outside the filament-substrate region such that the total energy density directly deposited on the substrate surface will not be exceedingly high and yet activated reactants can still be yielded and transported to the substrate.

In conclusion, the new diamond growth process disclosed herein provides an enhanced nucleation density and growth rate due to the addition of DC plasmas to the hot filament CVD of diamond with electrode configuration (substrate-hot filament-grid) which allows efficient ion extraction and growth precursor transportation towards the substrate during diamond nucleation and growth respectively as compared to the filament-grid-substrate configuration, and substrate-filament-substrate configuration. In addition, the present method provides considerable flexibility in maintaining the DC plasma away from the substrate surface for the minimization of excessive substrate heating.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A method of growing a diamond film by hot filament discharge, comprising:
    a) positioning a substrate having a deposition surface on a substrate holder in a vapor deposition chamber, providing a grid electrode spaced from said substrate deposition surface, providing a filament array electrode interposed between said grid electrode and said substrate deposition surface;
    b) flowing a gas mixture comprising hydrogen and gas containing carbon into said vapor deposition chamber and resistively heating the filament array electrode to a temperature in a range of from about 1800° C. to about 2600° C., said substrate being heated to a temperature in the range from about 600° C. to about 1100° C.;
    c) nucleating the substrate by biasing the filament array electrode at a positive voltage with respect to said substrate holder, and biasing said grid electrode at a voltage positive with respect to the voltage on said filament array electrode to provide an effective potential drop between said grid electrode and said substrate for efficient ion extraction toward said substrate; thereafter
    d) biasing said grid electrode at a voltage positive with respect to the voltage on said filament array electrode to grow a diamond film on the deposition surface.

2. The method according to claim 1 wherein during nucleating the substrate the substrate is biased at ground potential and the filament array electrode is biased to a potential in a range from about 20 to about 300 Volts with respect to ground, and the grid electrode is biased to a voltage in a range from about 20 to about 300 Volts with respect to the filament array electrode.

3. The method according to claim 2 wherein during the step of growing the diamond film after the step of nucleating the substrate holder and filament array electrode are biased at ground potential and the grid electrode is biased at a voltage in a range from about 20 to 300 Volts with respect to the filament array electrode.

4. The method according to claim 2 wherein during the step of growing the diamond film after the step of nucleating the substrate holder is biased at ground potential and the filament array electrode is biased at a negative voltage with respect to the substrate holder, said negative voltage being in a range from about −20 to about −300 Volts with respect to the substrate holder.

5. The method according to claim 1 wherein said gas containing carbon is selected from the group consisting of hydrocarbons, hydrocarbons containing oxygen and/or nitrogen, hydrocarbons containing halogens, carbon vapor, CO and $CO_2$.

6. The method according to claim 5 wherein said gas mixture further comprises any one of $O_2$, $F_2$, and $H_2O$ and an inert gas, and any combination thereof.

7. The method according to claim 5 wherein said gas mixture is maintained at a pressure in the range of from about 10 to 500 Torr.

8. The method according to claim 1 wherein said filament array electrode is resistively heated using a power supply selected from the group consisting of alternating current and direct current power supplies.

9. The method according to claims 1 including one of heating, not heating and cooling said grid electrode during growth of said diamond film.

10. The method according to claims 1 wherein when said substrate is on said substrate holder said filament array electrode is spaced from said deposition surface of said substrate on which said diamond film is being synthesized at a distance less than or equal to about 2 cm, said filament array electrode being spaced from said grid electrode at a distance less than or equal to about 5 cm.

11. A method of growing a diamond film by hot filament discharge, comprising:
    a) positioning substrates each having a deposition surface on first and second spaced substrate holders in a vapor deposition chamber, providing a grid electrode located between said first and second substrate holders and a first filament array electrode interposed between said first substrate holder and said grid electrode and a second filament array electrode interposed between said second substrate holder and said grid electrode;
    b) flowing a gas mixture comprising hydrogen and gas containing carbon into said vapor deposition chamber and resistively heating the first and second filament array electrodes to a temperature in a range of from about 1800° C. to about 2600° C., said substrates being heated to a temperature in the range from about 600° C. to about 1100° C.;
    c) nucleating said substrates on said first and second substrate holders by biasing the first filament array electrode at a positive voltage with respect to said first substrate holder to provide a plasma having an effective potential drop between said grid electrode and said first substrate for efficient ion extraction in said plasma toward said substrates on said first substrate holder, and biasing said grid electrode at a voltage positive with respect to the voltage on said second filament array electrode to provide a plasma having an effective potential drop between said grid electrode and said second substrate for efficient ion extraction in said plasma toward said substrates on said second substrate holder; thereafter d) biasing said grid electrode at a voltage positive with respect to the voltage on said first and second filament array electrodes to grow a diamond film on the deposition surfaces of the substrates on the first and second substrate holder.

12. The method according to claim 11 wherein when said substrates are located on said substrate holders, said first filament array electrode is spaced from said deposition surface of said substrates on said first substrate holder at a distance less than or equal to about 2 cm, said first filament array electrode being spaced from said grid electrode at a distance less than or equal to about 5 cm, and wherein said second filament array electrode is spaced from said deposition surface of said substrates on said second substrate holder at a distance less than or equal to about 2 cm, said second filament array electrode being spaced from said grid electrode at a distance less than or equal to about 5 cm.

13. The method according to claim 11 wherein said first and second filament array electrodes are resistively heated using a power supply selected from the group consisting of alternating current and direct current power supplies.

14. The method according to claim 11 including one of heating, not heating and cooling said grid electrode during growth of said diamond film.

15. A method of growing a diamond film by hot filament discharge, comprising:

a) positioning substrates each having a deposition surface on first and second spaced substrate holders in a vapor deposition chamber, providing a first filament array electrode spaced from said first substrate holder and a second filament array electrode interposed between said first filament array electrode and said second substrate holder;

b) flowing a gas mixture comprising hydrogen and gas containing carbon into said vapor deposition chamber and resistively heating the first and second filament array electrodes to a temperature in a range of from about 1800° C. to about 2600° C., said substrates being heated to a temperature in the range from about 600° C. to about 1100° C.; and c) biasing said first and second filament array electrodes and said first and second substrate holders to produce a plasma to grow a diamond film on the deposition surface of substrates on the first and second substrate holders.

16. The method according to claim 15 wherein said first and second substrate holders are in opposing relationship, said first filament array electrode is spaced from the surface of the substrate on the first substrate holder at a distance less than or equal to about 2 cm, said second filament array electrode being spaced from the surface of the substrate on the second substrate holder at a distance less than or equal to about 2 cm, and said first and second filament array electrodes are spaced from each at a distance of less than or equal to about 5 cm.

17. The method according to claim 15 wherein said first and second filament array electrodes are resistively heated using a power supply selected from the group consisting of alternating current and direct current power supplies.

* * * * *